(12) United States Patent
Sato

(10) Patent No.: US 10,347,464 B2
(45) Date of Patent: Jul. 9, 2019

(54) CYCLE-AVERAGED FREQUENCY TUNING FOR LOW POWER VOLTAGE MODE OPERATION

(71) Applicant: Lam Research Corporation, Fremont, CA (US)

(72) Inventor: Arthur H. Sato, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 818 days.

(21) Appl. No.: 14/854,555

(22) Filed: Sep. 15, 2015

(65) Prior Publication Data

US 2017/0076916 A1 Mar. 16, 2017

(51) Int. Cl.
*H01J 37/32* (2006.01)
*H01L 21/67* (2006.01)
*H01L 21/3065* (2006.01)

(52) U.S. Cl.
CPC .. *H01J 37/32155* (2013.01); *H01J 37/32183* (2013.01); *H01L 21/3065* (2013.01); *H01L 21/67069* (2013.01)

(58) Field of Classification Search
CPC ... H01J 37/321–32183; H01J 37/32715; H01J 2237/327; H01J 2237/334; H01L 21/3065; H01L 21/32155; H01L 21/67069; H05H 2001/4652–4667
See application file for complete search history.

(56) References Cited

U.S. PATENT DOCUMENTS

| | | | |
|---|---|---|---|
| 6,252,354 B1* | 6/2001 | Collins | H01J 37/321 118/723 I |
| 8,828,259 B2 | 9/2014 | Sato | |
| 9,059,101 B2 | 6/2015 | Sato | |
| 2003/0019581 A1* | 1/2003 | Drewery | H01J 37/32082 156/345.43 |
| 2013/0135058 A1 | 5/2013 | Long et al. | |
| 2014/0367044 A1 | 12/2014 | Sato | |
| 2015/0170925 A1* | 6/2015 | Chen | H01J 37/32045 438/758 |

\* cited by examiner

*Primary Examiner* — Benjamin Kendall

(57) ABSTRACT

A system for performing a rapid alternating process (RAP) etch includes a bias frequency adjustment module that selectively adjusts a bias frequency of a bias radio frequency (RF) source. The bias RF source provides a bias power to a substrate processing system. A control module determines a tuned frequency of the bias RF source. The tuned frequency corresponds to an impedance matching value. The control module controls the bias frequency adjustment module to adjust the bias frequency to a detuned frequency. The detuned frequency increases the bias power of the bias RF source to a predetermined range.

9 Claims, 5 Drawing Sheets

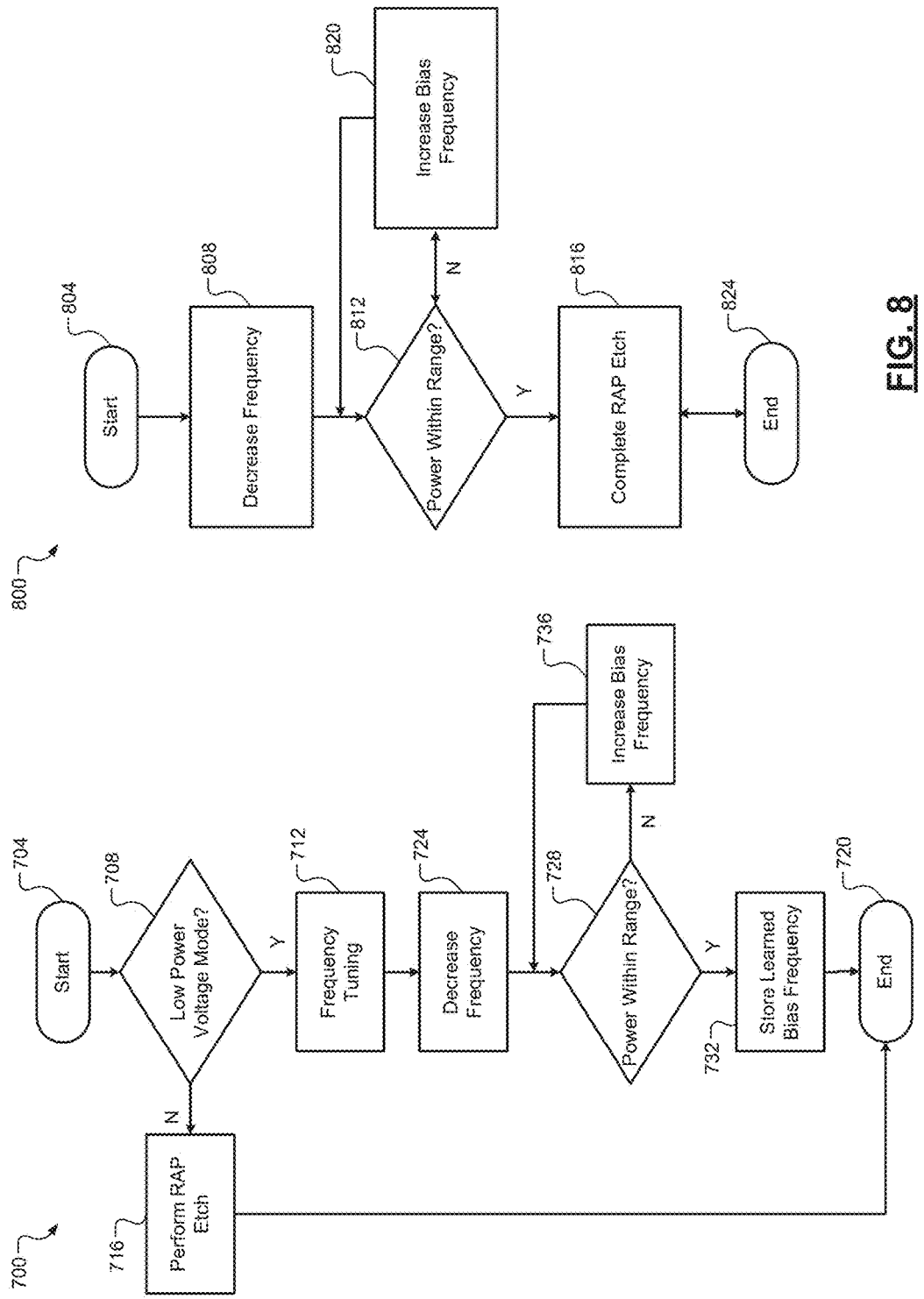

CYCLE-AVERAGED FREQUENCY TUNING FOR LOW POWER VOLTAGE MODE OPERATION

FIELD

The present disclosure relates to substrate processing systems, and more particularly to substrate processing systems and methods for etching substrates using a rapid alternating process.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to deposit and etch thin film on substrates such as semiconductor wafers. The substrate processing systems generally include a processing chamber, a plasma generator, a gas delivery system, a gas distribution device and a substrate support. A gas mixture is introduced into the processing chamber and plasma may be used to initiate chemical reactions.

Inductively-coupled plasma may be generated by one or more transformer-coupled plasma (TCP) coils. The TCP coils receive radio frequency (RF) power supplied by an RF power generator. A dielectric window, constructed of a material such as ceramic, is incorporated into an upper surface of the processing chamber. The dielectric window allows the RF power from the TCP coils to be transmitted into the processing chamber. The RF power excites gas molecules within the processing chamber to generate plasma.

An RF bias source supplies RF bias power to the substrate support. The RF bias power can be used to increase a DC bias (a difference in electrical potential between a surface within the processing chamber and ground) and/or a sheath potential (a potential of the plasma) to increase the energy with which charged particles in the plasma strike the substrate. The RF bias power may be adjusted by a process recipe.

Some substrate processing systems implement a rapid alternating process (RAP). The RAP alternates etching and deposition cycles. Different process parameters are used for the etching and deposition cycles. These process parameters may include, but are not limited to, different gas chemistries, pressures, RF bias voltages, inductive coil voltages, etc.

SUMMARY

A system for performing a rapid alternating process (RAP) etch includes a bias frequency adjustment module that selectively adjusts a bias frequency of a bias radio frequency (RF) source. The bias RF source provides a bias power to a substrate processing system. A control module determines a tuned frequency of the bias RF source. The tuned frequency corresponds to an impedance matching value. The control module controls the bias frequency adjustment module to adjust the bias frequency to a detuned frequency. The detuned frequency increases the bias power of the bias RF source to a predetermined range.

A method for performing a rapid alternating process (RAP) etch includes providing a bias power to a substrate processing system, selectively adjusting a bias frequency of a bias radio frequency (RF) source that provides the bias power, and determining a tuned frequency of the bias RE source. The tuned frequency corresponds to an impedance matching value. The method further includes adjusting the bias frequency to a detuned frequency. The detuned frequency increases the bias power of the bias RF source to a predetermined range.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 7 illustrates an example bias frequency learning method according to the present disclosure; and FIG. 8 illustrates an example bias frequency detuning method according to the present disclosure.

In the drawings, reference numbers may be reused to identify similar and/or identical elements.

DETAILED DESCRIPTION

A substrate processing system generates plasma in a substrate processing chamber using an inductive coil, an RF source, and a matching circuit. The matching circuit matches an impedance of the RF source to the impedance of the inductive coil. For example, the RF source may implement frequency tuning to perform power matching. In frequency tuning implementations, the reflected power and/or the delivered power may be measured. The RF source varies frequencies of RF signals provided to the matching circuit based on the measured reflected and/or delivered power.

Conversely, a RF bias source and a bias matching circuit may be used to bias a substrate support based on a bias power (i.e., a bias forward power). In some implementations of a rapid alternating process (RAP), a low TCP power (e.g., approximately 500 W) may be used (e.g., in a low power voltage mode), resulting in a very low bias forward power (e.g., approaching 1 W) and instabilities in the operation of the bias RF source.

Substrate processing systems and methods according to the principles of the present disclosure perform frequency detuning on the RF bias source to increase the bias power output by the RF bias source. For example, the frequency detuning is implemented to adjust a bias frequency (a frequency of the output of the RF bias source) to increase a bias reflected power, which consequently increases the bias forward power.

Figure 1:
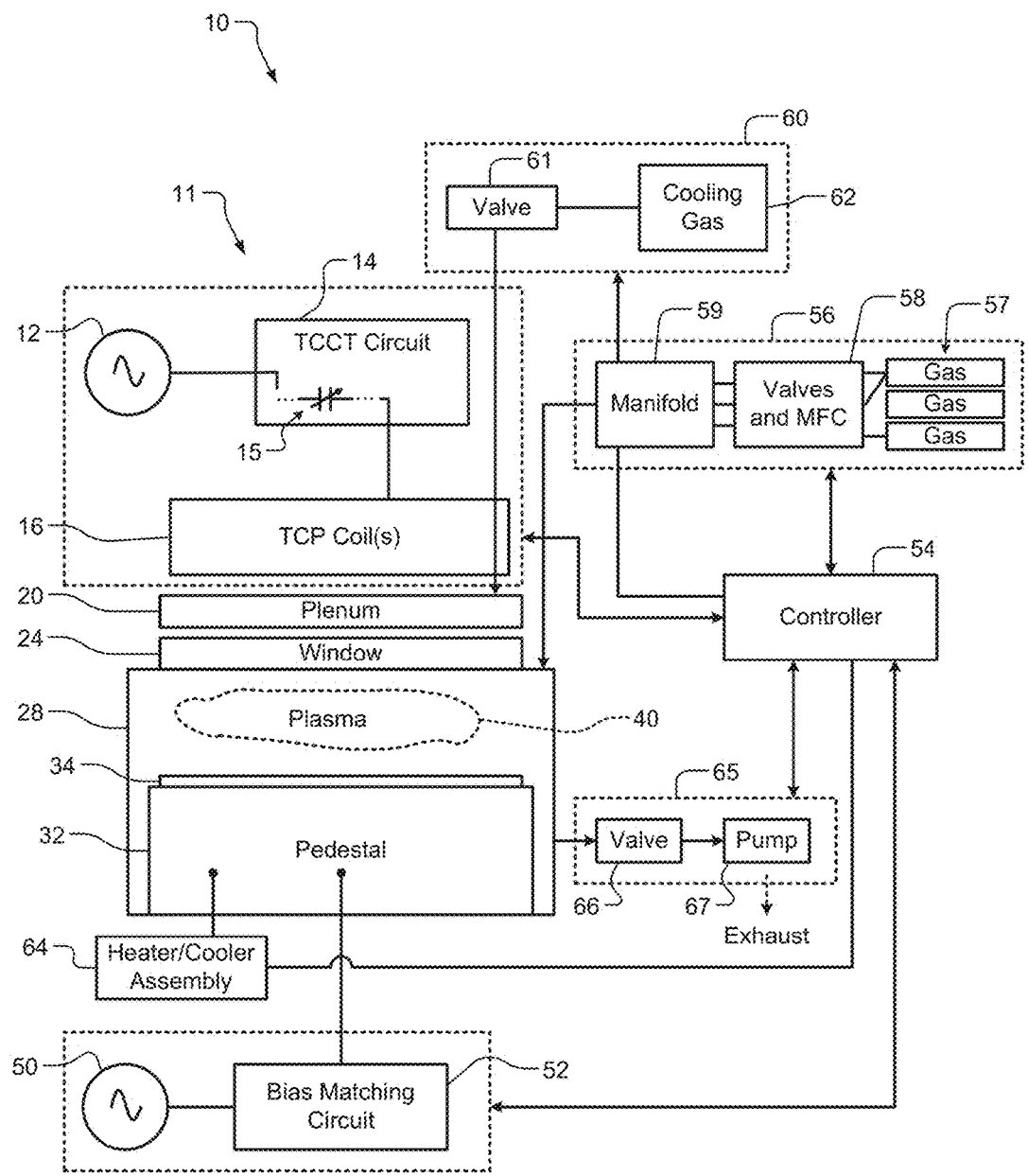
FIG. 1 is a functional block diagram of an example of a substrate processing system for etching substrates according to the present disclosure.

Referring now to FIG. 1, an example of a substrate processing system 10 according to the present disclosure is shown. The substrate processing system 10 includes a match network 11 (e.g., a TCP match network). An RF source 12 is connected to a transformer-coupled capacitive tuning (TCCT) circuit 14, which is connected to TCP coils 16. The TCCT circuit 14 typically includes one or more fixed or variable capacitors 15. An example of a TCCT circuit 14 is shown and described in commonly assigned U.S. Publication No. 2013/0135058 to Long et al., which is hereby incorporated by reference in its entirety. The TCP coils 16 may include a pair of coils or an inner coil pair and an outer coil pair.

A gas plenum 20 may be arranged between the TCP coils 16 and a window 24 (e.g., a dielectric window). The window 24 is arranged along one side of a processing chamber 28. The processing chamber 28 further comprises a pedestal 32 or other substrate support structure that supports a substrate 34. The pedestal 32 may include an electrostatic chuck, a mechanical chuck or other type of chuck. Process gas is supplied to the processing chamber 28 to generate plasma 40. The plasma 40 etches an exposed surface of the substrate 34. A bias RF source 50 and a bias matching circuit 52 are used to bias the pedestal 32 during operation.

A gas delivery system 56 may be used to supply a process gas mixture to the processing chamber 28. The gas delivery system 56 may include process and inert gas sources 57, a metering system 58 such as valves and mass flow controllers, and a manifold 59. A gas delivery system 60 may be used to deliver gas 62 via a valve 61 to the gas plenum 20. The gas may include cooling gas that is used to cool the TCP coils 16 and the window 24. A heater/cooler assembly 64 may be used to control the pedestal 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, etc. The controller 54 is further configured to implement frequency detuning of the bias RF source 50 during RAP etching according to the principles of the present disclosure.

Figure 2:
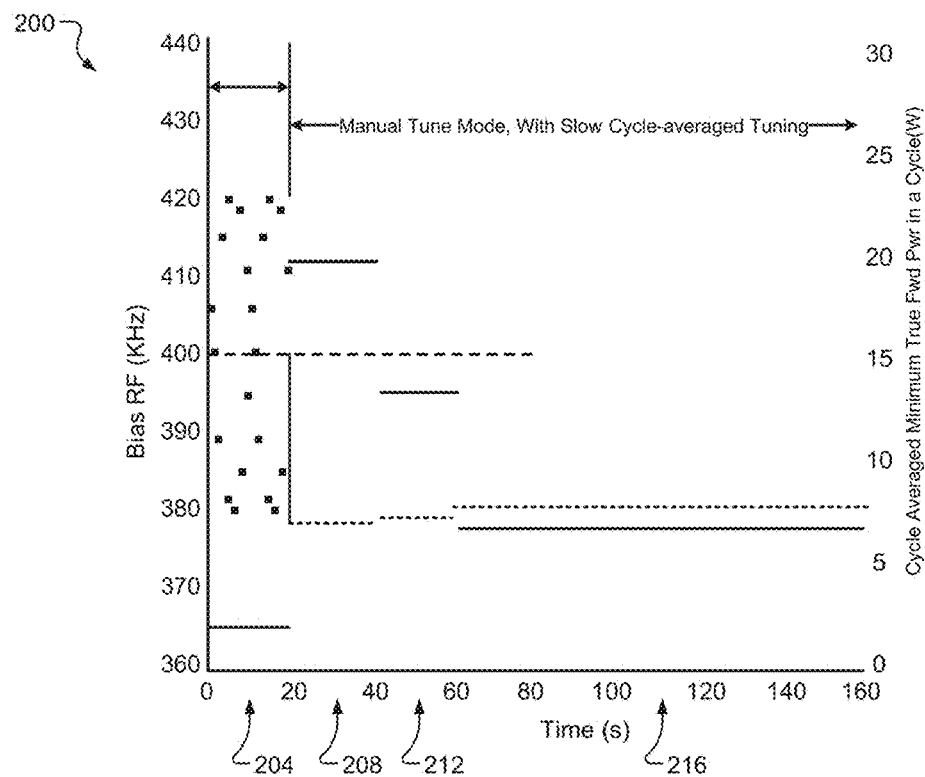
FIG. 2 illustrates an example bias frequency learning step according to the present disclosure.
Figure 3:
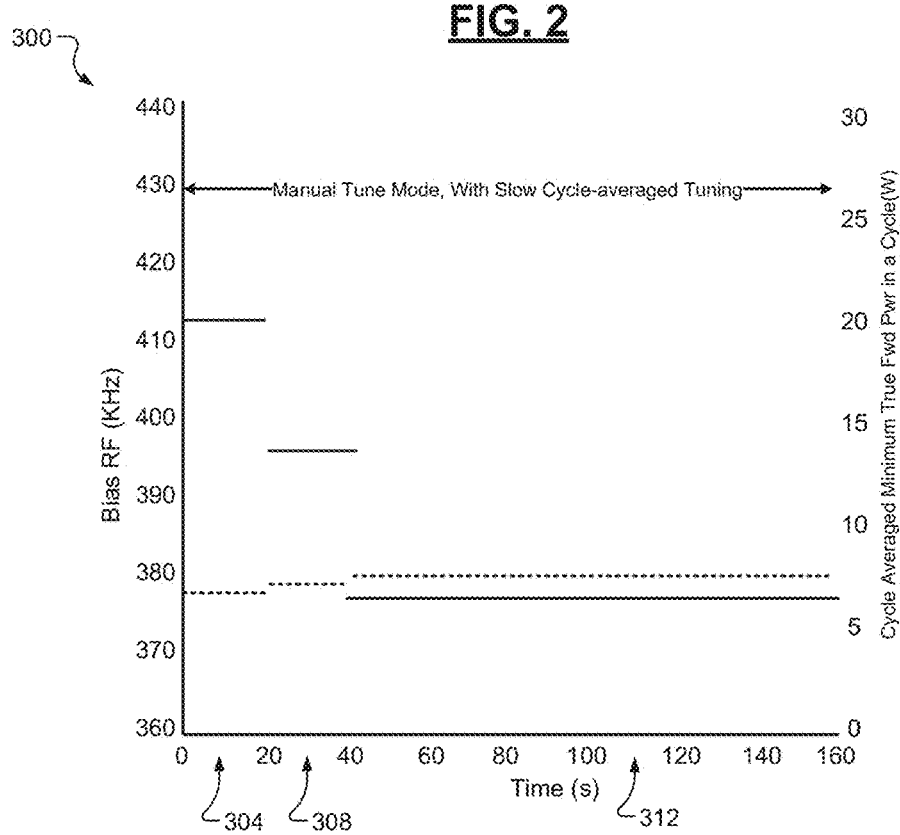
FIG. 3 illustrates an example bias frequency detuning process according to the present disclosure.

Referring now to FIGS. 2 and 3 and with further reference to FIG. 1, an example frequency detuning process as implemented by the controller 54 is described. FIG. 2 shows an example learning step 200 performed on a first wafer during RAP etching to determine (i.e., learn) a detuned bias frequency and FIG. 3 shows an example frequency detuning process 300 performed on a second wafer according to the learned detuned bias frequency during RAP etching.

In FIG. 2, a bias frequency (e.g., corresponding to a cycle-averaged frequency) is shown as a dashed line and a measured bias forward power (e.g., corresponding to a cycle-averaged minimum bias forward power) is shown as a solid line. A left y-axis corresponds to the bias frequency (in KHz). A right y-axis corresponds to the bias forward power (in W). The x-axis corresponds to time (e.g., where RAP etching starts at 0). During a first period 204 (e.g., from 0 to 20 s), the bias frequency is tuned (e.g., according to any frequency tuning method, such as an algorithm to minimize reflected power, which may be referred to as, for example only, "impedance matching") to achieve a desired impedance matching using the bias matching circuit 52. For example only, the resulting tuned bias frequency may be approximately 400 KHz. As shown at 204, the tuned bias frequency may correspond to a bias forward power of less than approximately 2 W.

During the first period 204, the controller 54 samples the bias frequency during tuning to determine an average of the bias frequency. For example only, the average of the bias frequency (e.g., an average of a plurality of frequency samples taken during the first period 204) may be calculated as approximately 400 KHz. In other words, the calculated average may approximately correspond to the resulting tuned bias frequency.

The controller 54 detunes the bias frequency (i.e., performs an adjustment away from the tuned bias frequency of 400 KHz) until the bias forward power is within a predetermined range (e.g., 5 to 10 W). The controller 54 adjusts the bias frequency beginning in a second period 208 (e.g., from 20 to 40 s). For example, the controller 54 adjusts (decreases) the bias frequency to 378 KHz, causing the bias forward power to increase significantly (e.g., for example only, to approximately 20 W). The controller 54 may adjust the bias frequency based on a predetermined first offset (e.g., 22 KHz) from the tuned bias frequency of 400 KHz.

In a third period 212 (e.g., from 40 to 60 s), the controller 54 increases the bias frequency (e.g., to 379 KHz), causing the bias forward power to decrease (e.g., to approximately 13 W). In a fourth period 216 (e.g., from 60 s until completion of the RAP etching step), the controller 54 increases the bias frequency (e.g., to 380 KHz), causing the bias forward power to decrease within the predetermined range (e.g., to 7 W). The controller 54 then stores data indicating the selected bias frequency corresponding to the desired bias forward power (i.e., a learned bias frequency). In the present example, the stored data indicates a learned bias frequency of 380 KHz corresponding to a bias forward power of 7 W. The controller 54 may also determine a second offset from the learned bias frequency of 380 KHz. For example, the second offset may be 2 KHz.

In other words, as described in FIG. 2, the controller 54 performs frequency tuning in the first period 204 to achieve impedance matching, determines a cycle-averaged frequency corresponding to the tuned bias frequency, decreases the bias frequency in the second period 208 to increase the bias forward power, and then increases the bias frequency in subsequent periods (e.g., the third period 212 and the fourth period 216) until the bias forward power decreases into a desired range. In this manner, the controller 54 learns the bias frequency corresponding to a desired bias forward power.

In FIG. 3, the controller 54 implements the frequency detuning process 300 with a second wafer according to the learned bias frequency determined in FIG. 2. In a first period 304 (e.g., from 0 to 20 s, at the start of RAP etching), the controller 54 decreases the bias frequency to a value corresponding to the learned bias frequency minus the second offset (e.g., to 380 KHz-2 KHz, or 378 KHz), causing the bias forward power to increase (e.g. to 20 W). In a second period 308, the controller 54 increases the bias frequency to 379 KHz, causing the bias forward power to decrease (e.g., to 13 W). In a third period 312, the controller 54 increases the bias frequency to 380 KHz, causing the bias forward power to decrease to 7 W, within the desired range of 5-10 W. In some examples, the controller 54 may adjust the bias frequency directly to the learned bias frequency of 380 KHz in the first period 304 without incrementing from an offset as described.

Figure 4:
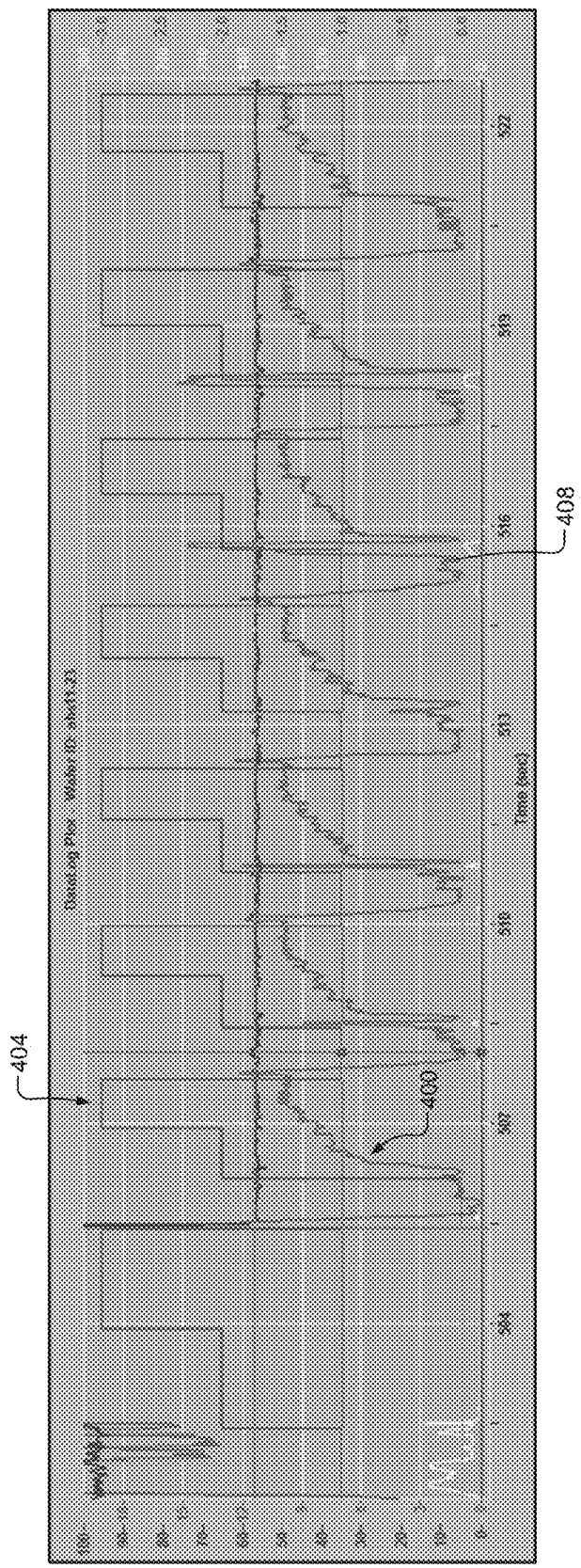
FIG. 4 illustrates an example bias forward power as measured over a plurality of RAP cycles according to the present disclosure.

As shown in FIGS. 2 and 3, the bias forward power may correspond to an average of a minimum bias forward power as measured (e.g., using a voltage sensor) over a number of RAP cycles. FIG. 4 shows an example bias forward power 400 as measured over a plurality of RAP cycles 404. A minimum bias forward power 408 is sampled in each of the cycles 404, and the average of the sampled minimum bias forward power 408 is calculated. In an example, the controller 54 implements the learning step 200 and the frequency detuning process 300 as described in FIGS. 2 and 3 according to the average of the minimum bias forward power 408. In other examples, the controller 54 may instead calculate an average overall of the bias forward power 400, an average median of the bias forward power 400, etc.

Figure 5:
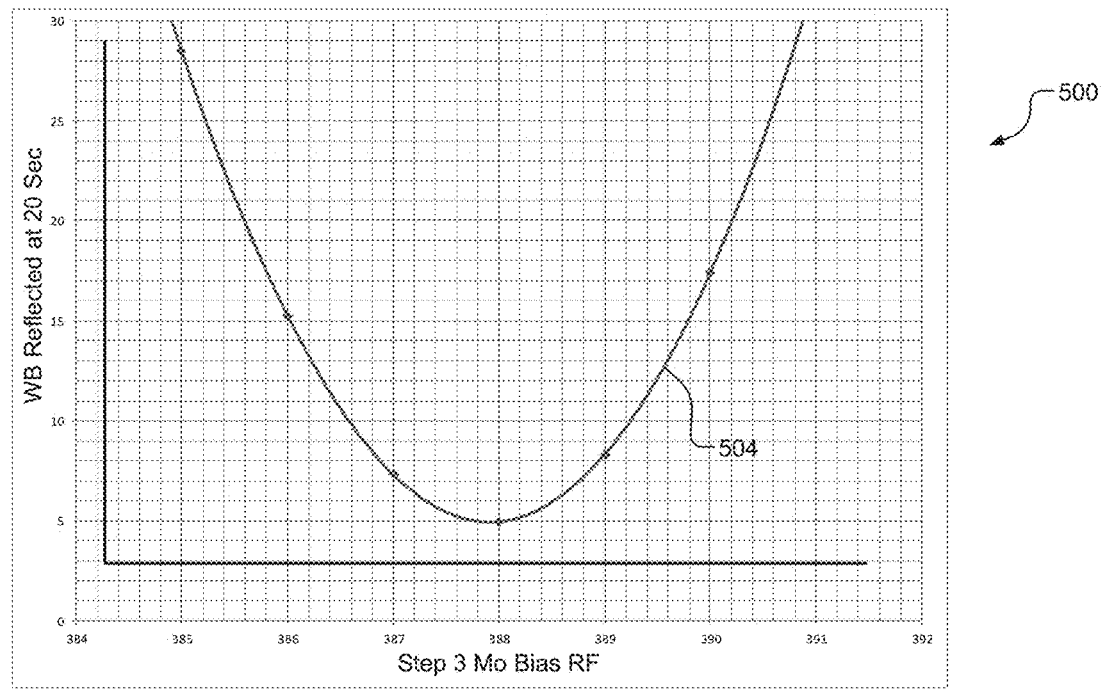
FIG. 5 illustrates an example bias frequency tuning well according to the present disclosure.

FIG. 5 shows an example bias frequency tuning well 500. The bias frequency tuning well 500 illustrates bias reflected power 504 for a range of bias frequencies. The bias reflected power 504 is indicative of bias forward power at each bias frequency. For example, the bias forward power may have the same parabolic shape as the bias reflected power 504 but may be shifted upward or downward. As shown, the bias reflected power 504 decreases (e.g., from approximately 28 W to approximately 5 W) as the bias frequency increases from 385 KHz to 388 KHz. Conversely, the bias reflected power 504 increases (e.g., from approximately 5 W to approximately 28 W) as the bias frequency increases from 388 KHz to 391 KHz.

The controller 54 may select the predetermined first offset as described in FIG. 2 based on the bias frequency tuning well 500. For example, the controller 54 may select the first offset such that the initial bias frequency (i.e., the bias frequency used for the second period 208) positions the bias reflected power (and, therefore, the bias forward power) on the left side of the bias frequency tuning well 500. In other words, the first offset is selected such that the bias frequency used in the second period 208 corresponds to a bias forward power between, for example only, 15 and 20 W. Accordingly, as the bias frequency is increased during the learning step 200, the bias forward power decreases toward the predetermined range of 5 to 10 W.

Figure 6:
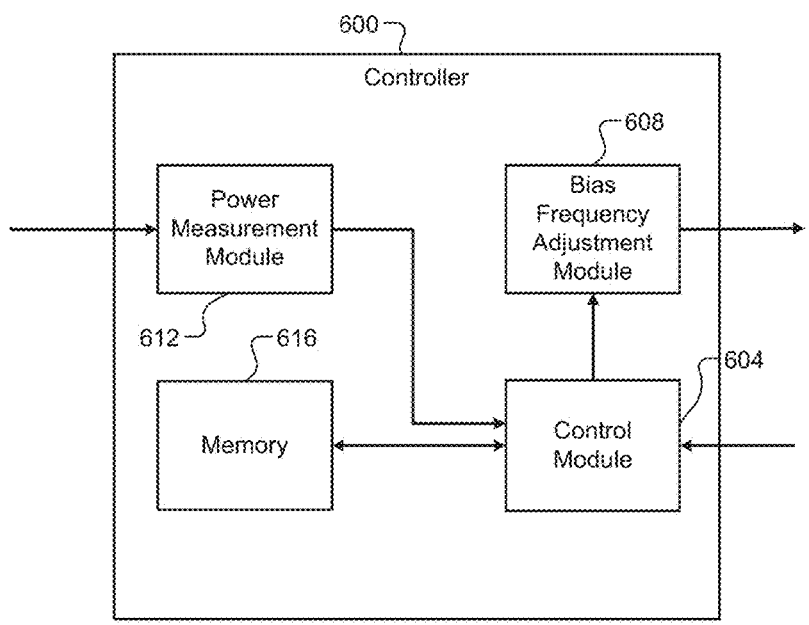
FIG. 6 is a functional block diagram of an example controller according to the present disclosure.

Referring now to FIG. 6, an example controller 600 includes a control module 604, a bias frequency adjustment module 608, a power measurement module 612, and memory 616. The control module 604 selectively implements functions of the learning step 200 and the frequency detuning process 300 as described in FIGS. 1-4. For example, the control module 604 may initiate the learning step 200 and/or the frequency detuning process 300 based on a determination of whether RAP etching is being performed in a low power voltage mode. If the low power voltage mode is selected (e.g., if the RAP etching is being performed in a recipe/process, substrate processing tool, etc. that uses a low TCP power), the control module 604 controls the bias frequency adjustment module 608 accordingly. For example, in the low power voltage mode, the bias frequency adjustment module 608 may control the bias frequency according to commands received from the control module 604 during the learning step 200 and the frequency detuning process 300. Conversely, if the lower power voltage mode is not selected, the bias frequency adjustment module 608 may control the bias frequency according to a determined tuned bias frequency.

If RAP etching is being performed in the low power voltage mode, the control module 604 provides commands to the bias frequency adjustment module 608 based on a measured bias forward power received from the power measurement module 612 and various data stored in the memory 616. For example, the power measurement module 612 receives a signal (e.g., samples from one or more sensors) indicative of the measured bias forward power and provides the measured bias forward power to the control module 604. For example only, the power measurement module 612 calculates an average of a minimum bias forward power over a plurality of cycles as described above in FIG. 4 and outputs the average as the measured bias forward power.

The memory 616 stores data including, but not limited to, a desired range for the bias forward power, the average bias frequency as determined during the first period 204, the predetermined first offset, the learned detuned bias frequency as determined in periods 208, 212, and 216, an amount to increment the bias frequency (e.g., 1 KHz) in respective periods of the learning step 200, the second offset, etc. The control module 604 stores the data in the memory 616 as calculated during the learning step 200 and the frequency detuning process 300 and retrieves predetermined and/or previously calculated data from the memory 616 as needed.

Referring now to FIG. 7, an example RAP etch method 700 (e.g., as performed in a low power voltage mode) performs a detuned bias frequency learning step according to the principles of the present disclosure, beginning at 704. For example, the controller 600 implements the method 700. At 708, the method 700 determines whether the low power voltage mode is selected. For example, the control module 604 may receive an input from a user indicating that the low power voltage mode is selected, the substrate processing tool including the control module 604 may automatically select the low power voltage mode when a particular recipe or process is being performed, a selected recipe or process may provide an indication to the control module 604 that the low power voltage mode will be selected during the recipe, etc. If true, the method 700 continues to 712. If false, the method 700 continues to 716. At 716, the RAP etch is performed in a normal operation mode (e.g., using a tuned bias frequency) and the method 700 ends at 720.

At 712, the method 700 performs frequency tuning to tune the bias frequency for impedance matching. At 724, the method 700 decreases the bias frequency (i.e., detunes the bias frequency) to increase the bias forward power. For example, the method 700 decreases the bias frequency according to a predetermined first offset. At 728, the method 700 determines whether the bias forward power is within a predetermined range. For example, the control module 604 receives a measured bias forward power from the power measurement module 612 and compares the measured bias forward power to the predetermined range (e.g., as stored in the memory 616). If true, the method 700 continues to 732. If false, the method 700 continues to 736. At 736, the method 700 increases the bias frequency to decrease the bias forward power and continues to 728. At 732, the method 700 stores the currently selected bias frequency as the learned detuned bias frequency and ends at 720.

Referring now to FIG. 8, an example RAP etch method 800 performs a frequency detuning process according to the principles of the present disclosure, beginning at 804. For example, the controller 600 implements the method 800. At 808, the method decreases the bias frequency (i.e., detunes the bias frequency) to increase the bias forward power. For example, the method 800 decreases the bias frequency according to a second offset. At 812, the method 800 determines whether the bias forward power is within a predetermined range. For example, the control module 604 receives a measured bias forward power from the power measurement module 612 and compares the measured bias forward power to the predetermined range (e.g., as stored in the memory 616). If true, the method 800 continues to 816. If false, the method 800 continues to 820. At 820, the method 800 increases the bias frequency to decrease the bias forward power and continues to 812. At 816, the method 800 completes the RAP etch and ends at 824.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for performing a rapid alternating process (RAP) etch, the system comprising:
   a bias frequency adjustment module configured to selectively adjust a bias frequency of a bias radio frequency (RF) source, wherein the bias RF source provides a bias power to a substrate processing system; and
   a control module configured to (i) determine a tuned frequency of the bias RF source, wherein the tuned frequency corresponds to an impedance matching value, (ii) control the bias frequency adjustment module to adjust the bias frequency to the tuned frequency, (iii) subsequent to controlling the bias frequency adjustment module to adjust the bias frequency to the tuned frequency, control the bias frequency adjustment module to adjust the bias frequency to a first detuned frequency to increase the bias power of the bias RF source, (iv) determine whether the bias power is within a predetermined range in response to the bias frequency being adjusted to the first detuned frequency, and (v) selectively control the bias frequency adjustment module to adjust the bias frequency to a second detuned frequency based on the determination of whether the bias power is within the predetermined range.

2. The system of claim 1, wherein the control module is configured to control the bias frequency adjustment module to adjust the bias frequency to the second detuned frequency in response to a determination that the bias power is not within the predetermined range.

3. The system of claim 1, wherein, to adjust the bias frequency to the first detuned frequency, the control module is configured to control the bias frequency adjustment module to decrease the bias frequency to increase the bias power.

4. The system of claim 3, wherein, subsequent to decreasing the bias frequency, the control module is configured to control the bias frequency adjustment module to increase the bias frequency a first time to the second detuned frequency to decrease the bias power.

5. The system of claim 4, wherein, subsequent to increasing the bias frequency the first time, the control module is configured to control the bias frequency adjustment module to increase the bias frequency at least one second time to decrease the bias power until the bias power is within the predetermined range.

6. The system of claim 1, wherein, to control the bias frequency adjustment module to adjust the bias frequency to the first detuned frequency, the control module is configured to control the bias frequency adjustment module to adjust the bias frequency based on an offset from a stored detuned frequency.

7. The system of claim 1, wherein the control module is configured to receive an indication of the bias power and selectively control the bias frequency adjustment module to adjust the bias frequency based on the indication of the bias power.

8. The system of claim 7, wherein the indication of the bias power corresponds to a minimum bias power measured by a power measurement module.

9. The system of claim 7, wherein the indication of the bias power corresponds to an average of a minimum bias power measured by a power measurement module over a plurality of cycles of the RAP etch.

* * * * *